(12) United States Patent
Compen et al.

(10) Patent No.: US 9,013,682 B2
(45) Date of Patent: Apr. 21, 2015

(54) CLAMPING DEVICE AND OBJECT LOADING METHOD

(75) Inventors: Rene Theodorus Petrus Compen, Valkenswaard (NL); Johannes Henricus Wilhelmus Jacobs, Heeze (NL); Martinus Hendrikus Antonius Leenders, Rhoon (NL); Joost Jeroen Ottens, Veldhoven (NL); Martin Frans Pierre Smeets, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 947 days.

(21) Appl. No.: 12/451,749

(22) PCT Filed: Jun. 20, 2008

(86) PCT No.: PCT/NL2008/050407
§ 371 (c)(1),
(2), (4) Date: Apr. 16, 2010

(87) PCT Pub. No.: WO2008/156366
PCT Pub. Date: Dec. 24, 2008

(65) Prior Publication Data
US 2010/0195080 A1    Aug. 5, 2010

Related U.S. Application Data

(63) Continuation-in-part of application No. 11/812,818, filed on Jun. 21, 2007, now abandoned, which is a continuation-in-part of application No. 11/896,600, filed on Sep. 4, 2007, now Pat. No. 8,446,566.

(60) Provisional application No. 60/935,381, filed on Aug. 9, 2007, provisional application No. 60/960,578, filed on Oct. 4, 2007.

(51) Int. Cl.
*G03F 7/20* (2006.01)
*H01L 21/683* (2006.01)
*H01L 21/687* (2006.01)

(52) U.S. Cl.
CPC ............ *G03F 7/70783* (2013.01); *G03F 7/707* (2013.01); *H01L 21/6838* (2013.01); *H01L 21/68742* (2013.01); *H01L 21/6875* (2013.01)

(58) Field of Classification Search
CPC . G03F 7/707; G03F 7/70708; G03F 7/70733; G03F 7/70758; G03F 7/70775; G03F 7/70783; G03F 7/70533; G03F 7/709; H01L 21/6838; H01L 21/68742; H01L 21/6875
USPC ........... 355/53, 72–76, 91–94, 30, 52, 55, 77; 250/492.1, 492.2, 492.22, 548; 269/20, 269/30; 361/234; 248/682, 683, 693, 510, 248/363
See application file for complete search history.

(56) References Cited

U.S. PATENT DOCUMENTS 4,391,511 A * 7/1983 Akiyama et al. ................. 355/40
4,561,688 A * 12/1985 Tsutsui ............................ 279/3

(Continued)

FOREIGN PATENT DOCUMENTS

EP   1 077 393 A2   2/2001
EP   1 241 706 A2   9/2002

(Continued)

OTHER PUBLICATIONS

English translation of Chinese Office Action directed to related Chinese Application No. 200880021138.2, mailed Jul. 18, 2011 from the State Intellectual Property Office of People's Republic of China; 30 pages.

(Continued)

*Primary Examiner* — Christina Riddle
(74) *Attorney, Agent, or Firm* — Sterne, Kessler, Goldstein & Fox P.L.L.C.

(57) ABSTRACT

The present invention relates to a clamping device configured to clamp an object (20, 120) on a support (1, 101). The clamping device comprises: a first device configured to force the object and the support away from each other using a first force, and a second device configured to force the object and the support towards each other using a second force. The first device and second device are configured to simultaneously exert the first force and the second force respectively to shape the object to a desired shape before completing the clamping of the object on the support.

42 Claims, 8 Drawing Sheets

(56) References Cited

U.S. PATENT DOCUMENTS

| | | | |
|---|---|---|---|
| 4,737,824 A * | 4/1988 | Sakai et al. | 355/53 |
| 5,231,291 A | 7/1993 | Amemiya et al. | |
| 5,534,073 A * | 7/1996 | Kinoshita et al. | 118/728 |
| 5,562,396 A | 10/1996 | Yamazaki et al. | |
| 5,564,682 A * | 10/1996 | Tsuji | 269/21 |
| 5,573,877 A * | 11/1996 | Inoue et al. | 430/30 |
| 5,610,683 A | 3/1997 | Takahashi | |
| 5,793,474 A * | 8/1998 | Nishi | 355/72 |
| 5,922,605 A | 7/1999 | Feurstein et al. | |
| 5,923,408 A * | 7/1999 | Takabayashi | 355/53 |
| 6,226,073 B1 | 5/2001 | Emoto | |
| 6,252,758 B1 | 6/2001 | Nagao et al. | |
| 6,257,564 B1 | 7/2001 | Avneri et al. | |
| 6,496,350 B2 | 12/2002 | Fujiwara | |
| 6,628,503 B2 | 9/2003 | Sogard | |
| 6,721,035 B1 | 4/2004 | Segers et al. | |
| 6,762,826 B2 * | 7/2004 | Tsukamoto et al. | 355/72 |
| 6,965,428 B2 | 11/2005 | Muto et al. | |
| 7,070,661 B2 | 7/2006 | Eiriksson et al. | |
| 7,718,925 B2 | 5/2010 | Goto et al. | |
| 8,446,566 B2 | 5/2013 | Kuit et al. | |
| 2001/0002871 A1 | 6/2001 | Nagao et al. | |
| 2003/0067734 A1 | 4/2003 | Nakano | |
| 2003/0102682 A1 | 6/2003 | Kurokawa | |
| 2005/0039685 A1 | 2/2005 | Eiriksson et al. | |
| 2005/0181711 A1 | 8/2005 | Starikov et al. | |
| 2005/0252455 A1 | 11/2005 | Moriya | |
| 2006/0023394 A1 * | 2/2006 | Bain et al. | 361/234 |
| 2006/0213900 A1 * | 9/2006 | Matsuda et al. | 219/444.1 |
| 2007/0103659 A1 | 5/2007 | Yoshitake et al. | |
| 2007/0128889 A1 | 6/2007 | Goto et al. | |
| 2008/0316461 A1 | 12/2008 | Compen | |
| 2009/0059199 A1 | 3/2009 | Kuit et al. | |
| 2009/0086187 A1 | 4/2009 | Compen et al. | |

FOREIGN PATENT DOCUMENTS

| | | | |
|---|---|---|---|
| JP | 59-046030 A | 3/1984 | |
| JP | 61-094322 A | 5/1986 | |
| JP | 62-288913 A | 12/1987 | |
| JP | 09-246362 A | 9/1997 | |
| JP | 2000-021964 A | 1/2000 | |
| JP | 2001-093808 A | 4/2001 | |
| JP | 2001-127145 A | 5/2001 | |
| JP | 2002-305238 A | 10/2002 | |
| JP | 2003-115442 A | 4/2003 | |
| JP | 2003-321117 A | 11/2003 | |
| JP | 2004-165439 A | 6/2004 | |
| JP | 2007-019224 A | 1/2007 | |
| JP | 2007-158077 A | 6/2007 | |
| KR | 10-2001-0070935 A | 7/2001 | |
| WO | WO 2006/090730 A1 | 8/2006 | |

OTHER PUBLICATIONS

English language translation of Japanese Notice of Reasons for Rejection directed to related Japanese Patent Application No. 2010-513139, mailed Dec. 8, 2011, from the Japanese Patent Office; 4 pages.

English-Language Translation of Notice of Reasons for Rejection directed to related Japanese Patent Application No. 2010-513140, mailed Nov. 14, 2011, from the Japanese Patent Office; 4 pages.

Non-Final Rejection marled Dec. 1, 2011 for U.S. Appl. No. 11/896,600, filed Sep. 4, 2007; 8 pages.

Compen et. al., "Lithographic Apparatus and Device Manufacturing Method," U.S. Appl. No. 11/812,818, filed Jun. 21, 2007.

International Search Report for Application No. PCT/NL2008/050412 mailed Aug. 21, 2008, 3 pgs.

International Search Report for Application No. PCT/NL2008/050407 mailed Sep. 25, 2008, 3 pgs.

Non-Final Rejection mailed Oct. 20, 2008 for U.S. Appl. No. 11/896,600, 6 pgs.

Second Non-Final Rejection mailed Aug. 4, 2009 for U.S. Appl. No. 11/896,600, 10 pgs.

Non-Final Rejection mailed Jul. 30, 2009 for U.S. Appl. No. 11/812,818, 18 pgs.

Final Rejection mailed Feb. 3, 2012 for U.S. Appl. No. 11/896,600, filed Sep. 4, 2007; 9 pages.

Notice of Allowance mailed May 11, 2012 for U.S. Appl. No. 11/896,600, filed Sep. 4, 2007; 5 pages.

Final Rejection mailed Feb. 24, 2010 for U.S. Appl. No. 11/896,600, 11 pgs.

International Preliminary Report on Patentability and Written Opinion of the International Searching Authority directed to related International Patent Application No. PCT/NL2008/050412, mailed Dec. 22, 2009; 7 pages.

International Preliminary Report on Patentability and Written Opinion of the International Searching Authority directed to related International Patent Application No. PCT/NL2008/050407, mailed Dec. 22, 2009; 8 pages.

Notice of Allowance mailed Sep. 6, 2012 for U.S. Appl. No. 11/896,600, filed Sep. 4, 2007; 7 pages.

Corrected Notice of Allowability mailed Sep. 28, 2012 for U.S. Appl. No. 11/896,600, filed Sep. 4, 2007; 4 pages.

U.S. Appl. No. 13/649,696, Jan-Jaap Kuit, "Method of Loading a Substrate on a Substrate Table and Lithographic Apparatus and Device Manufacturing Method," filed Oct. 11, 2012.

Notice of Allowance mailed Dec. 10, 2012 for U.S. Appl. No. 11/896,600, filed Sep. 4, 2007; 7 pages.

Notice of Allowance mailed Mar. 14, 2013 for U.S. Appl. No. 11/896,600, filed Sep. 4, 2007; 7 pages.

English-Language Abstract for Japanese Patent Publication No. 09-246362 A, published Sep. 19, 1997; 1 page.

English-Language Abstract for Japanese Patent Publication No. 2001-093808 A, published Apr. 6, 2001; 1 page.

English-Language Abstract for Japanese Patent Publication No. 2007-019224 A, published Jan. 25, 2007; 1 page.

Non-Final Rejection mailed Nov. 24, 2014 for U.S. Appl. No. 13/649,696, filed Oct. 11, 2012; 12 pages.

* cited by examiner

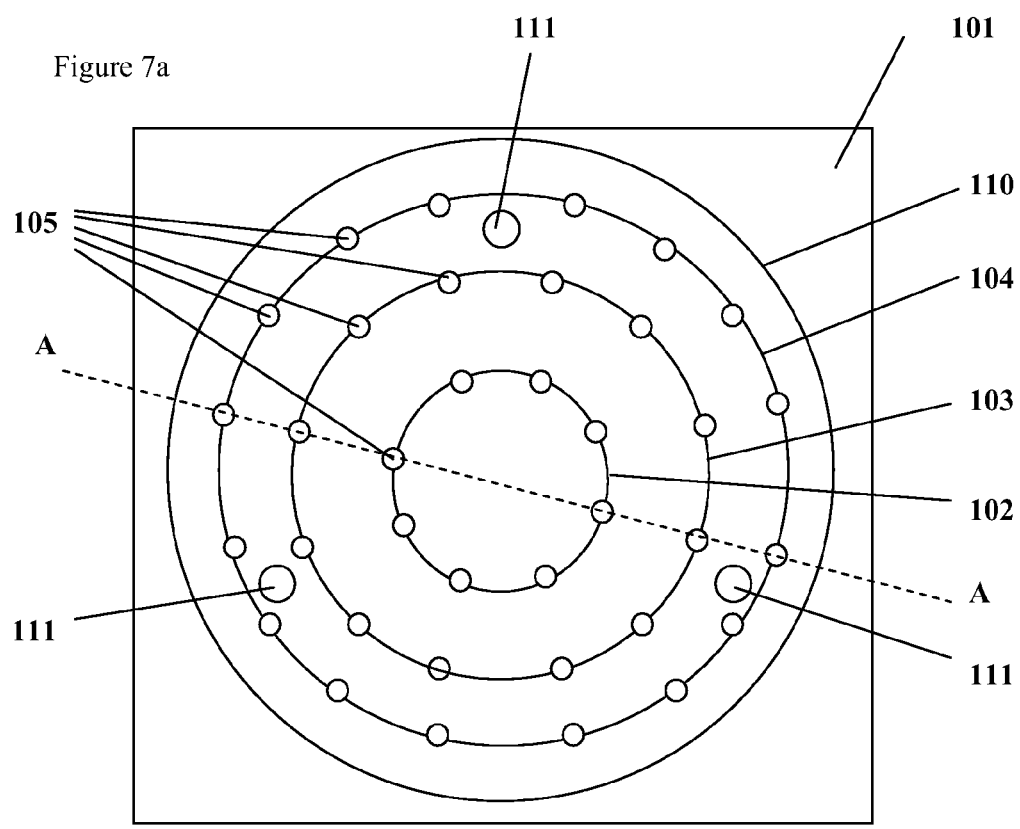
Figure 7a
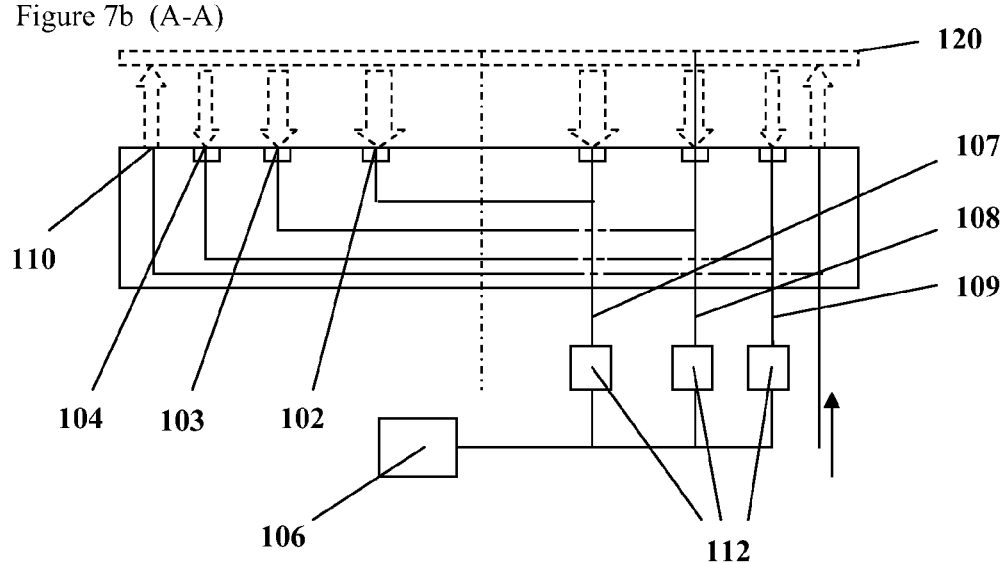
Figure 7b (A-A)

CLAMPING DEVICE AND OBJECT LOADING METHOD

CROSS-REFERENCE TO RELATED APPLICATIONS

This application is a 35 U.S.C. §371 U.S. national phase filing of International Application No. PCT/NL2008/050407, filed on 20 Jun. 2008, which is a continuation-in-part of U.S. application Ser. No. 11/812,818, filed 21 Jun. 2007 (now abandoned), and claims benefit of U.S. Appl. No. 60/935,381, filed 9 Aug. 2007, and is a continuation-in-part of U.S. application Ser. No. 11/896,600, filed 4 Sep. 2007 that issued as U.S. Pat. No. 8,446,566 on May 21, 2013), and claims benefit of U.S. Appl. No. 60/960,578, filed 4 Oct. 2007, each of which is hereby incorporated in its entirety by reference.

BACKGROUND

1. Field of the Invention

The present invention relates to a clamping device and a method for clamping an object on a support. The present invention further relates to a lithographic apparatus and a method for loading a substrate on a substrate support of a lithographic apparatus. Finally, the present invention relates to a machine readable medium.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of one or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus each substrate to be exposed, is loaded on a substrate support on which the substrate is supported during the exposure of a patterned beam of radiation. To clamp the substrate on the substrate support a clamping device is provided. In a known embodiment of the lithographic apparatus a vacuum clamping device is used. Such a vacuum clamping device provides a vacuum force with which the substrate is clamped on the supporting surface of the substrate support. In the case a substrate is straight, the substrate will be clamped on the support surface without any substantial internal stresses in the substrate.

However, substrates may not be straight, but for instance be warped in a number of shapes, such as a corrugated shape, cylindrical shape, dome shaped, a saddle form or another shape. This may be caused by the production method used to make the substrate, or by pre- or post exposure processes to which the substrates are subjected during the manufacture.

When a warped substrate, for instance a dome-shaped substrate is clamped on a substrate support for instance by means of a vacuum clamp, the substrate may first contact with the substrate support at the outer circumference of the substrate and thereafter over the rest of the surface of the substrate. Due to the clamping force the substrate is forced into a substantially straight form, while the clamping is started at the outer circumference of the substrate. As a result, stresses may be induced in the substrate when it is clamped on the supporting surface. In this application 'warped' object will refer to any such shapes as cylinder, saddle, or other unwanted deformation of the shape of the object.

These stresses may have a negative influence on the final product quality. Also, since the substrate is clamped in another form than desired, the overlay performance of the projections of the lithographic apparatus may decrease which may have a negative influence on product quality.

SUMMARY

Applicants have determined that it is be desirable to provide a substrate support having a holding arrangement for substrates, wherein internal stresses in a substrate due to clamping forces are substantially decreased. Furthermore, it is be desirable to provide a clamping method with which a warped substrate is clamped on a substrate support thereby potentially decreasing the risk on stresses in the substrate and/or overlay errors.

According to an aspect of the invention, there is provided a clamping device configured to clamp an object on a support, comprising a first device configured to force the object and the support away from each other using a first force, and a second device configured to force the object and the support towards each other using a second force,
wherein the first device and second device are configured to simultaneously exert the first force and the second force respectively to shape the object to a desired shape before completing the clamping of the object on the support.

According to an aspect of the invention, there is provided a method for loading an object on a support, comprising the steps of shaping the object in a desired shape, wherein the shaping comprises subjecting the object simultaneously to a first force forcing the object and the support away from each other and a second force forcing the object and the support towards each other, and completing the clamping of the object on the support. Additionally, there is provided a machine readable medium encoded with machine executable instructions for performing the method.

According to a further aspect of the invention, a method is provided for loading a substrate on a substrate support of a lithographic apparatus. The method comprises:

shaping the substrate in a desired shape while keeping the substrate spaced from the substrate support, wherein the shaping comprises subjecting the substrate simultaneously to an attracting force pulling the object towards the support and a rejecting force pushing the substrate away from the support, and completing the clamping of the shaped substrate on the substrate support.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7a and 7b depict a top view and a cross section of another embodiment of a substrate support according to the invention.

DETAILED DESCRIPTION

Figure 1:
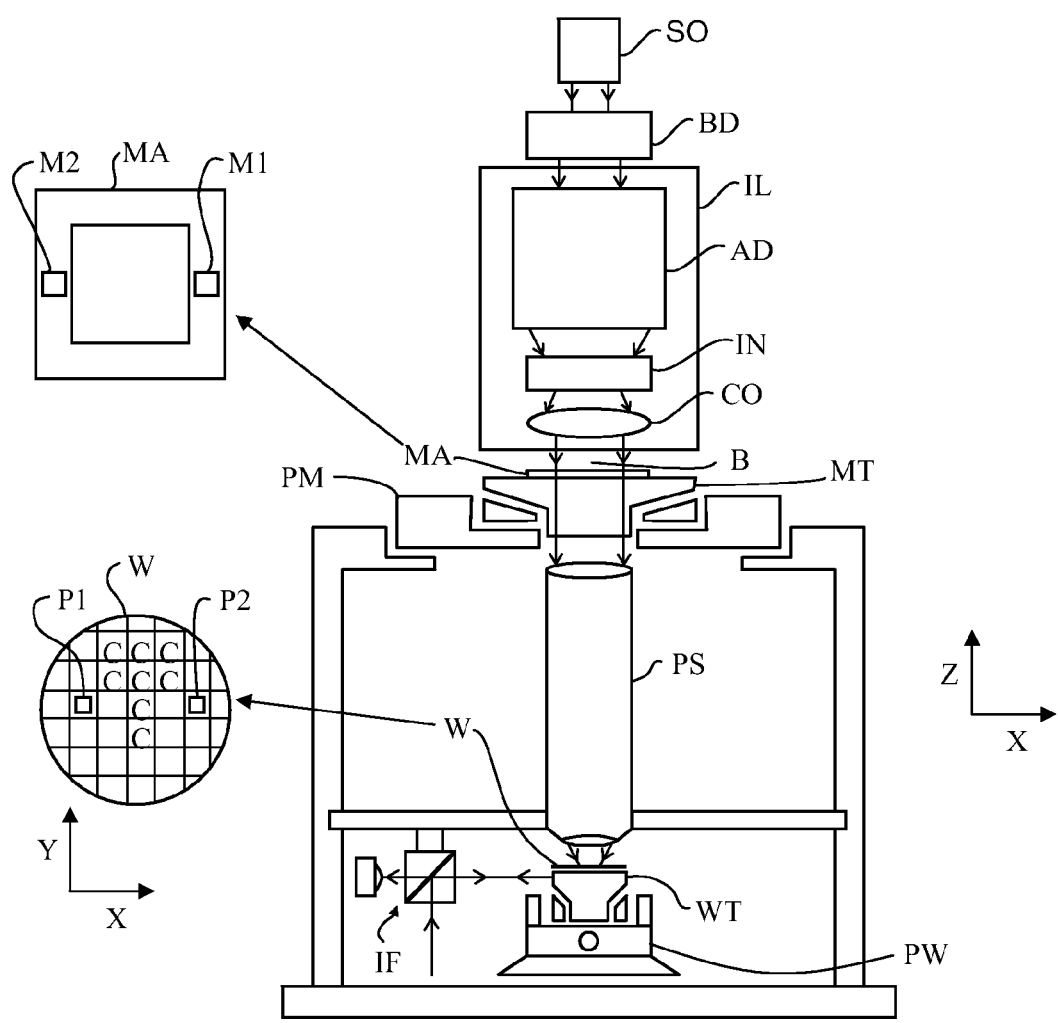
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
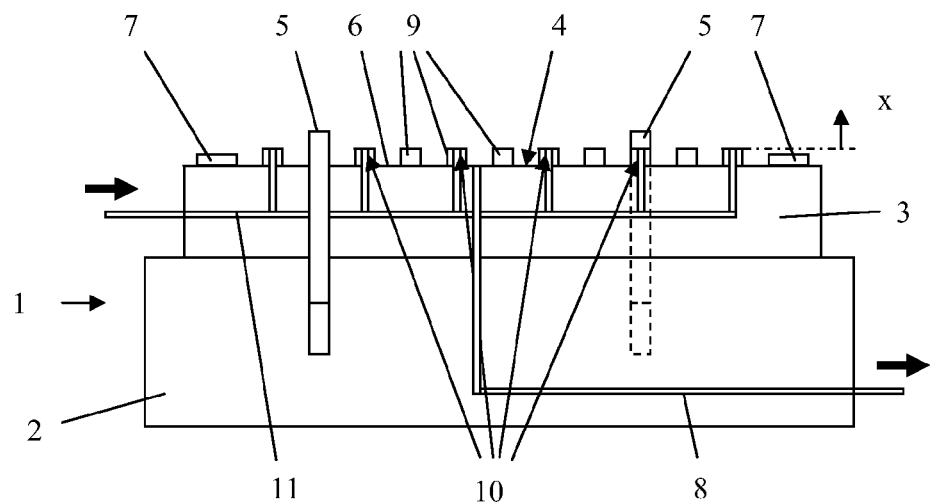
FIG. 2 depicts a side view of a substrate support according to the invention.
Figure 3:
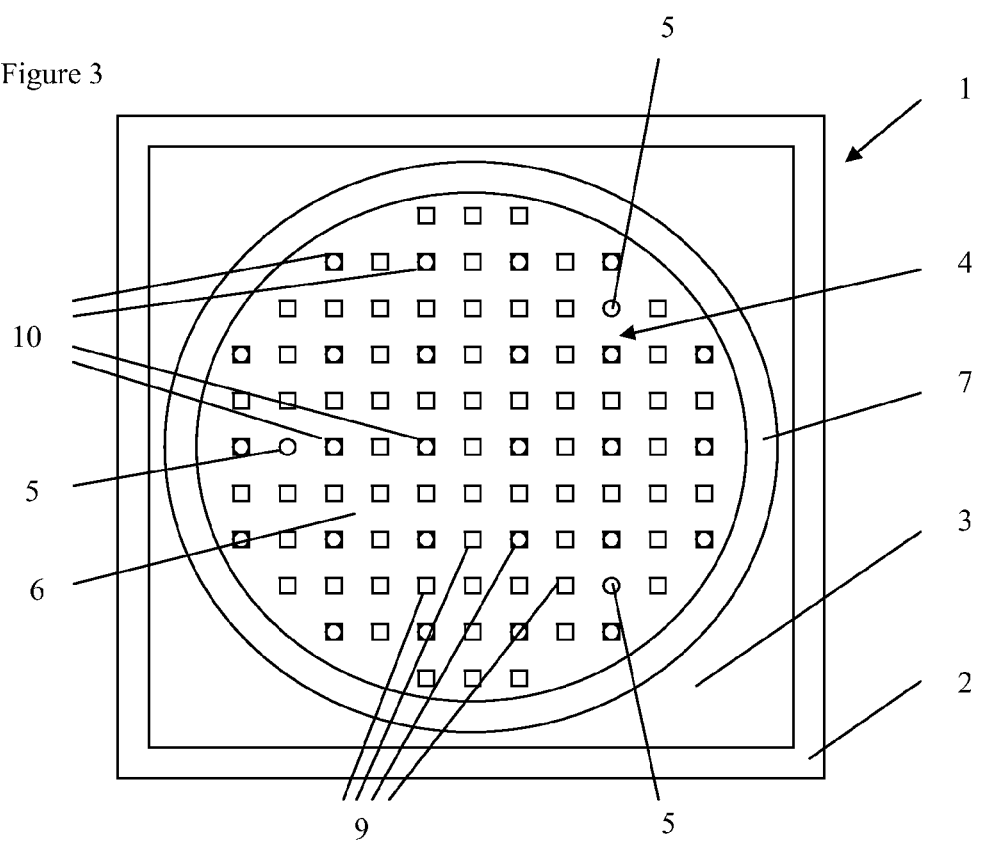
FIG. 3 depicts a top view of the substrate support of FIG. 2.

A substrate support 1 according to an embodiment of the invention comprises a mirror block 2 on which a substrate table 3 is placed. FIGS. 2 and 3 show a side view and top view of the substrate support 1 according to the embodiment, respectively.

The top side of the substrate support 1 comprises a vacuum clamp 4 to clamp a substrate on the substrate support 1. The substrate support 1 further comprises three retractable pins 5, also known as e-pins, which are movable with respect to the substrate support between an extended position in which the pins 5 extend from the substrate support 1 and a retracted position in which the pins 5 are retracted in the substrate support 1. The retractable pins 5 are movable in a substantially vertical direction, i.e., in a direction substantially perpendicular to a main plane of a substrate to be supported by the pins. The retractable pins 5 are used for transfer of a substrate between the substrate support 1 and a robot or any other type of substrate handler. The retractable pins 5 are provided so that a robot may be placed under the substrate for supporting it. When the robot is configured to hold the substrate at the sides or top, the retractable pins 5 may be omitted. In alternative embodiments any other type of device capable of exerting an attraction force on a substrate, such as electrostatic, magnetic or electromagnetic clamps may be used.

In the embodiment a robot places a substrate on the pins 5 in the extended position. Then the pins 5 are be moved to the retracted position so that the substrate comes to rest on the support surface of the substrate support 1. After a substrate supported by the substrate support 1 is exposed to a patterned beam of radiation, it is exchanged for another one. For exchange of the substrate it is lifted from the substrate table 3 by the retractable pins 5 which are moved from the retracted position to the extended position. When the pins 5 are in the extended position, the substrate is taken over by the robot or any other type of substrate handler.

The vacuum clamp 4 is formed by a recessed surface 6 which is surrounded by a sealing rim 7. A suction conduit 8 is provided to create a low pressure in a vacuum space delimited by the recessed surface 6, the sealing rim 7 and a substrate placed or to be placed on the substrate support 1. The suction conduit 8 is connected to a suction pump to draw air, or another gas present in the process environment, out of the vacuum space. The lower pressure provides a vacuum force which draws a substrate placed within a certain range above the supporting surface towards the substrate support 1. In this range, or at least a part thereof, the vacuum force exerted on the substrate is substantially independent of the distance x between the substrate support and the substrate.

In the recessed surface 6 a number of burls 9 are arranged. The top ends of the burls 9 provide support surfaces for a substrate to be placed on the substrate support 1. The sealing rim 7 and the top ends of the burls 9 may be arranged in substantially the same plane to provide a substantial flat surface for supporting a substrate. In an alternative embodiment the sealing rim 7 may be arranged lower than the burls 9, as shown in FIG. 2, or vice versa.

In an embodiment of the substrate support 1 two or more vacuum clamps are provided. In a further embodiment another device for providing an attracting force exerted on the substrate, i.e. a force forcing the substrate towards the substrate support, is be provided, such as an electrostatic, magnetic, or electromagnetic clamp. The force exerted by such clamp is preferably in a range above a supporting surface of the substrate support 1 independent of the distance x between the substrate support and the substrate. In an embodiment gravity is used as a clamping force. Gravity, dependent on the orientation of the clamping device, can be a (further) attracting force or a rejecting force. In an embodiment a pressure difference is used as either an attracting or rejecting force. Further springs and negative springs can be an option in embodiments.

In a number of burls 9 nozzles 10 are provided. In the embodiment shown in FIGS. 2 and 3, the nozzles 10 are evenly distributed over the surface area delimited by the sealing rim 7. The nozzles 10 are connected to a gas supply conduit 11 and are configured to provide a jet in a direction substantially perpendicular to the recessed surface, i.e., substantially perpendicular to the main plane of a substrate to be arranged on the substrate support 1. To actually provide a jet, a pump (not shown), or another source of pressurized gas, is connected to the supply conduit 11. In an alternative embodiment of the substrate support the nozzles 10 are not integrated in the burls, but separately provided. It is remarked that for the provision of the jets any type of suitable gas, such as air or $H_2$, may be used.

A substrate placed in the above-mentioned range wherein the clamp is active is subject to a force exerted by the jet which is dependent on the distance x between the substrate support 1 and the substrate.

In an alternative embodiment other devices may be provided to force the substrate away from the substrate support, for instance using a rejecting force. Such devices may for instance include linear or non-linear springs, or electrostatic, magnetic or electromagnetic devices. The rejecting force exerted on the substrate preferably decreases with increasing distance x between substrate support 1 and substrate.

Generally, it is remarked that the rejecting force and the attracting force are preferably provided by a device which is capable of exerting a force on the substrate without mechanical contact between the respective force exerting device and the substrate.

Figure 4A:
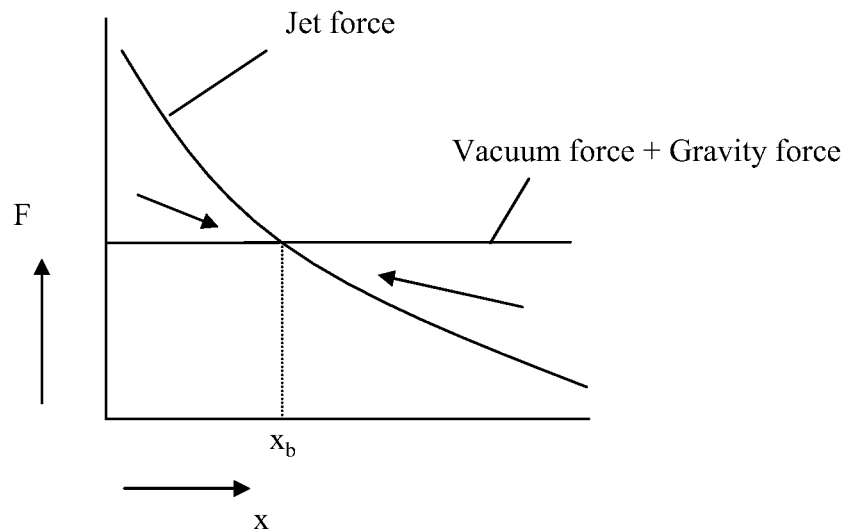
FIGS. 4a, 4b and 4c are diagrams showing exampled of the dependence of the attracting force and the rejecting force on the distance between the substrate and the substrate support.

In FIG. 4a the attracting vacuum force plus gravity force, and the rejecting jet force exerted on the substrate are shown in dependence on the distance x of the substrate from the substrate support for the embodiment. On the x-axis the distance x between the substrate support and the substrate is indicated for a certain range. On the y-axis the attracting force (combination of vacuum force and gravity force) and the rejecting force (jet force) are shown in dependence of the distance x.

In the embodiment, the vacuum force is independent of the distance x. The horizontal line in FIG. 4a shows the force with which the substrate and the support are driven towards each other. This force is the vacuum force corrected for the component of gravity working in the same direction as the vacuum force. Thus it can be said that the vacuum force and gravity cooperate. The rejecting force caused by the jets decreases with increasing distance x. Thus the attracting force is less dependent of the distance x than the rejecting force. At the balance distance $x_b$, the vacuum force corrected for gravity and the rejecting force are equal. The balance distance $x_b$ corresponds to a very stable distance. This is because when a substrate is present at this balance distance it will be held at this distance since these forces are equal meaning that there is no resultant force driving the substrate and the support to another distance. If the substrate and the support were to move away from each other anyway to distances larger than $x_b$ the attracting force would remain the same, whereas the rejecting force would decrease. As a consequence the rejecting force would be smaller than the attracting force driving the substrate and the support towards a smaller distance, i.e. towards balance distance $x_b$. If the substrate and the support were to move towards a distance x smaller than $x_b$, the attracting force would again remain unchanged, but the rejecting force would increase. Consequently the rejecting force would be larger than the attracting force and the substrate and the support would be forced away from each other towards the balance position $x_b$. In this way the substrate may be held and moved towards a balance position $x_b$ as indicated by arrows in FIG. 4a.

In the above embodiment the gravity is in the same direction as the attracting force. In an alternative embodiment there is an angle between them and the correction is to be made for the component of gravity that is in the same direction as the attracting force. Alternatively in an embodiment wherein a component of gravity acts in the same direction as the rejecting force, the rejecting force needs to be corrected for obtaining the balance distance $x_b$ and not the attracting force. In this embodiment the rejecting force and gravity cooperatively force the substrate away from the support.

Furthermore, not only the substrate as a whole will be moved towards the balance position. The balance between the attracting force and the rejecting force may also be used to shape the warped substrate to a desired shape. This may be advantageous in the case a substrate to be loaded on the substrate support is warped. When the balance distance $x_b$ is equal for the whole surface area of a substrate supported on the substrate support, the warped substrate may be straightened at the distance $x_b$, by balancing it for a certain time at this distance using the attracting and rejecting forces of the substrate support before it is clamped on the supporting surface of the substrate support.

In an embodiment, the straightening, or more generally the shaping may also be performed, while the substrate is moved towards the substrate support. In such embodiment the balance distance $x_b$ is decreased during shaping therewith moving the substrate towards the substrate support. The change in balance distance may be obtained by changing the attracting force and/or the rejecting force accordingly. For instance, in FIG. 4b is shown in dashed lines that the rejecting force is lowered resulting in another balance distance $x_b$–2, which is closer to the substrate support.

In an embodiment, unevenly distributed attracting and/or rejecting forces may be provided, for instance by an unevenly distributed number of nozzles or a difference in the jetting force or vacuum force by using different supply conduits or two or more vacuum clamps, preferably having an own suction conduit. In such embodiment the balance distance $x_b$ may be varied along the surface area of the substrate and as a result the substrate may be formed in a desired shape. In an embodiment unevenly distributed forces comprises locally absent forces. Parts of the object to be clamped can be free from forces acting upon it locally.

In an embodiment, it may be possible that both forces depend on the distance x between the substrate support 1 and the substrate 20. For instance, in FIG. 4c the attracting force, i.e., vacuum force plus gravity force, and the rejecting force, i.e., jet force, exerted on the substrate both decrease with increasing distance between the substrate support and the substrate. However, at shorter distances, smaller than $x_b$ the rejecting force is larger and at distances larger than $x_b$ the attracting force is larger. Thus the substrate will be held at the distance $x_b$, therewith creating the possibility of shaping the substrate, for instance straightening a warped substrate before clamping it on the substrate support.

Figure 4B:
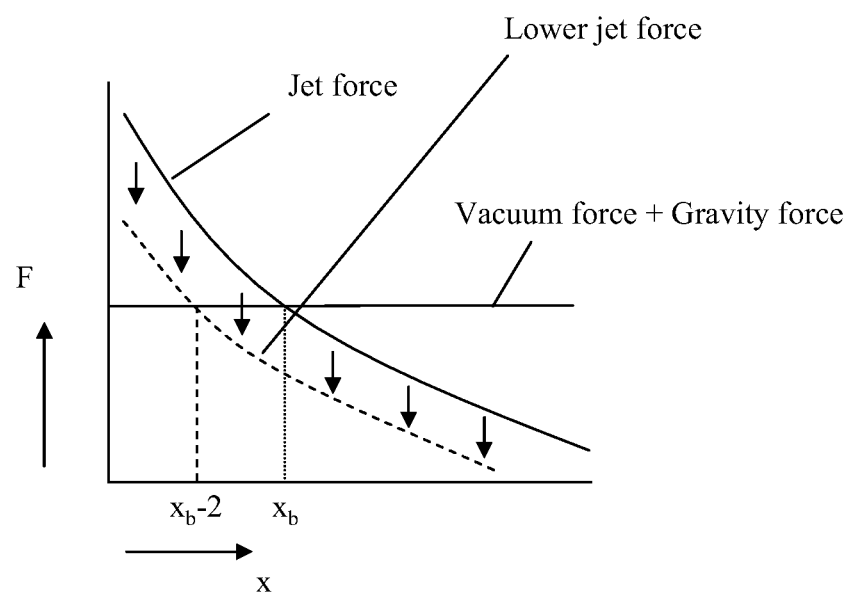
Figure 4C:
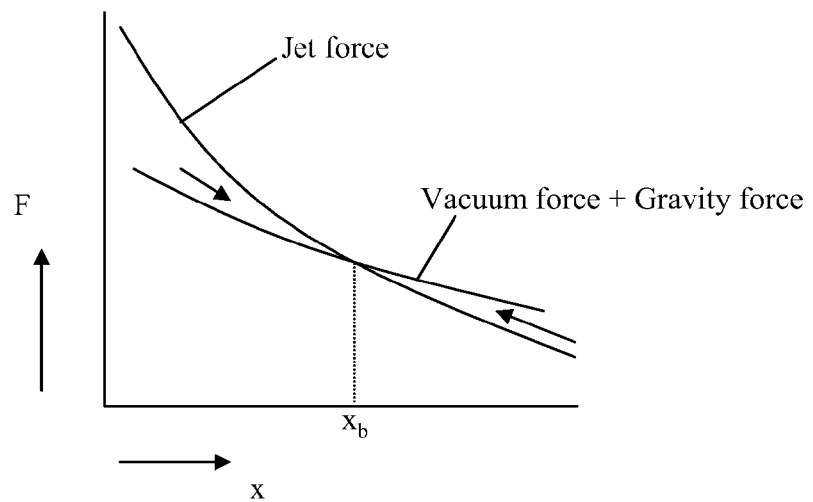

With respect to the diagrams shown in FIGS. 4a and 4b and the embodiments shown in the other figures, it is remarked that in these embodiments the gravity force is part or forms the attracting force since the substrate is clamped on the top side of the support. In alternative embodiments it may be possible that the substrate is clamped on the bottom side of a support, in which case gravity will be part of or form the rejecting force, or the substrate may be clamped at the side of a support in which case the gravity force will not play a role in the balance between the attracting force and the rejecting force.

Figure 5A:
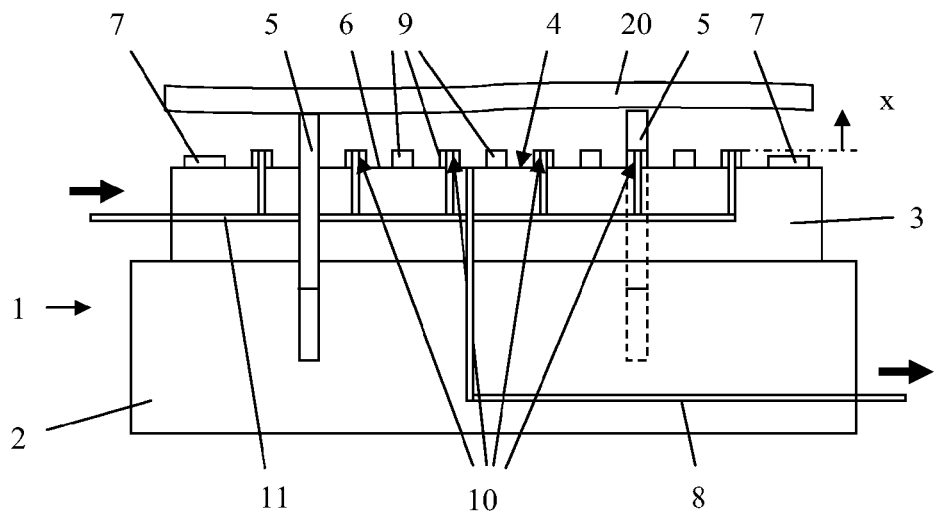
FIGS. 5a-5c depict three steps of the method according to the invention.
Figure 5B:
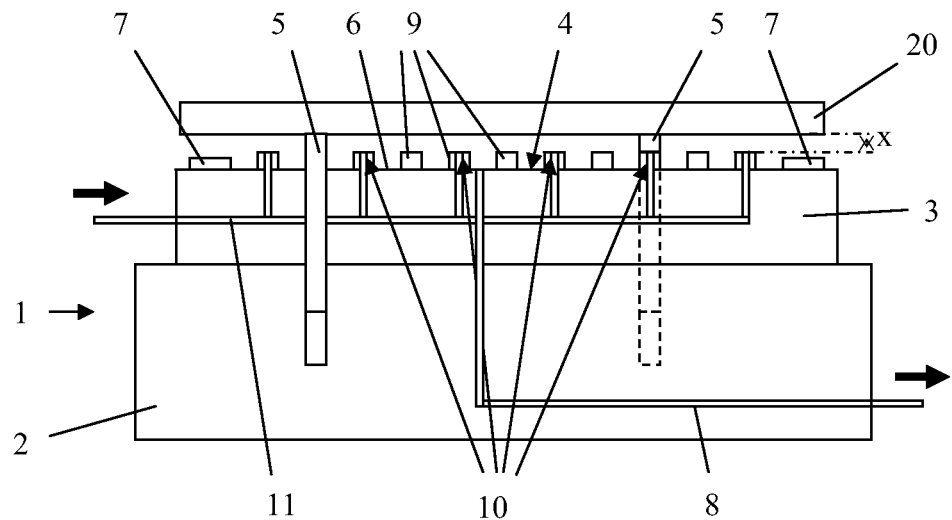
Figure 5C:
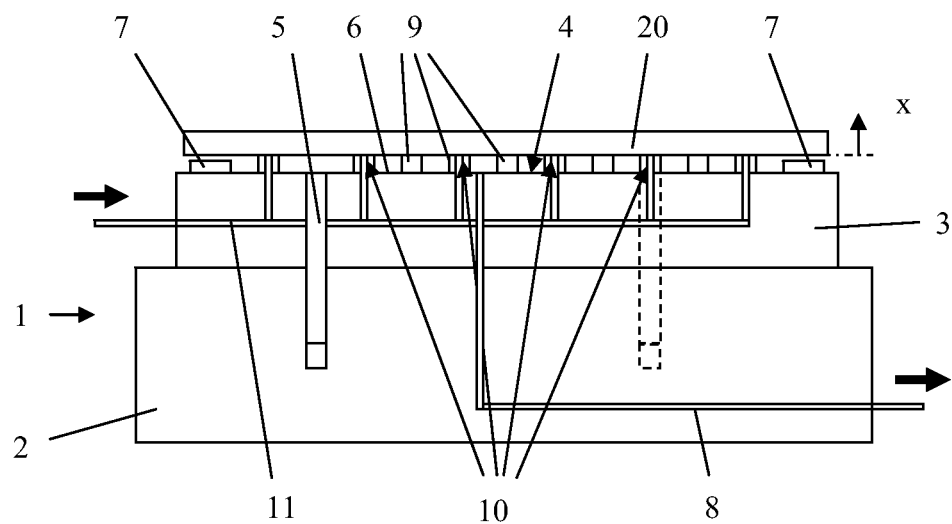

FIG. 5a-5c show some steps of a clamping method according to the invention for clamping a warped substrate 20 on a substrate support 1.

FIG. 5a shows the substrate support of FIG. 2 whereby a substrate 20 is placed on the retractable pins 5. The substrate 20 is warped, which for instance may be caused by a pre- or post exposure process such as coating, baking, chilling or developing of the substrate. In an embodiment warpage or any other kind of deformation of the shape of an object, specifically a substrate, can be caused by vias in the substrate. The height differences in the substrate are typically in the range of 5-50 micrometers, in particular for relatively new substrates, which have not been processed, for instance coated, baked, chilled and developed, but differences up to 450 micrometers or even more are possible as well, in particular after the substrates have been processed.

When such a warped substrate is loaded on the substrate support without further measures, the stresses may be introduced in the substrate 20 due to the clamping of the substrate 20 in the warped form. For instance, when the substrate is dome-shaped, first the outer circumference may be clamped and thereafter the middle of the substrate 20 is clamped. As the circumference of the warped substrate may be smaller than the circumference of the same straightened substrate, the clamping may result in stresses in the substrate.

In FIG. 5b the substrate 20 is moved downwards by retracting the pins 5 in the substrate support 1 to bring the substrate close to the balance position, i.e., the distance x between substrate 20 and substrate support 1 close to $x_b$. It is remarked that the balance distance $x_b$ may typically lie within the range 1-1000 micrometer, preferably in the range 1-100 micrometer. The preferred balance distance may also depend on the height differences which are present in the respective substrate.

To shape a warped substrate an attracting force and a rejecting force are simultaneously exerted on the substrate. The magnitude of these forces may be altered to change the balance position of the substrate.

Thereby, it may be possible that the substrate is shaped during movement of the substrate towards the substrate support. Also, the substrate may be shaped during a first approach of the substrate support and then be held at a certain distance, for instance between 1 and 100 micrometer to be further shaped to a substantially flat form before it is clamped on the substrate support.

Since the substrate 20 floats on the bed created by the jets, it is desirable that some fixation for the substrate is provided. For this reason the substrate 20 is still held by the retractable pins 5 for fixation in the x, y and Rz directions. However, to make the influence of the presence of the pins 5 on the straightening as small as possible, the pins have at least during the straightening phase a low stiffness in the vertical z-direction. Any other device for maintaining the substrate in substantially the same position in x, y and Rz directions may be also used. In some embodiment elements such as the pins 5 are present to increase the deformation of the shape of the object, to subsequently shape the object according to the invention. In some embodiments a certain deformation can be preferred since the deformation is more or less predictable.

When the straightening of the substrate 20 has finished, the substrate 20 is clamped on the substrate support 1 by making the attracting force larger than the rejecting force, for instance by increasing the vacuum force of the vacuum clamp 4 or by decreasing the velocity of the jets coming from the nozzles 10. As a consequence the substrate 20 comes to rest on the support surface of the substrate support 1. When the vacuum force is maintained the substrate 20 is clamped on the substrate support 1 while still being in a substantially straightened shape. As the loading process to clamp a substrate on the substrate support is completed, this situation is referred to as complete clamping.

In FIG. 5c, the substrate 20 is shown clamped on the substrate support 1 using the vacuum clamp 4. Since the substrate 20 is straightened during clamping on the substrate support the risk on internal stresses in the substrate 20 is substantially reduced and the overlay performance is therewith increased. The retractable pins 5 are moved to the retracted position.

It is remarked that the straightening phase may also be used for thermal conditioning of the substrate 20 by temperature control of the gas used for the jets.

Figure 6A:
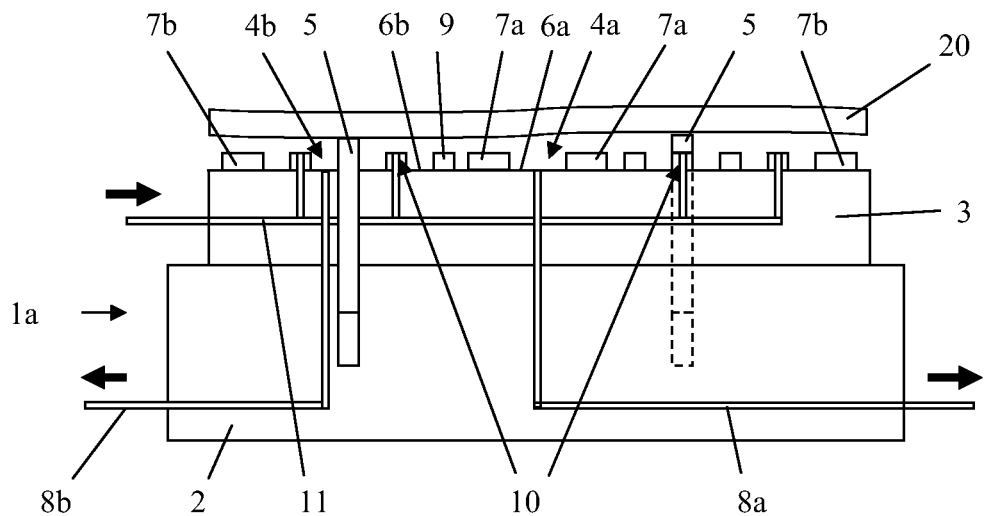
FIGS. 6a-6c depict a side view of an alternative embodiment of a substrate support according to the invention, and three steps of a clamping method according to the invention.
Figure 6B:
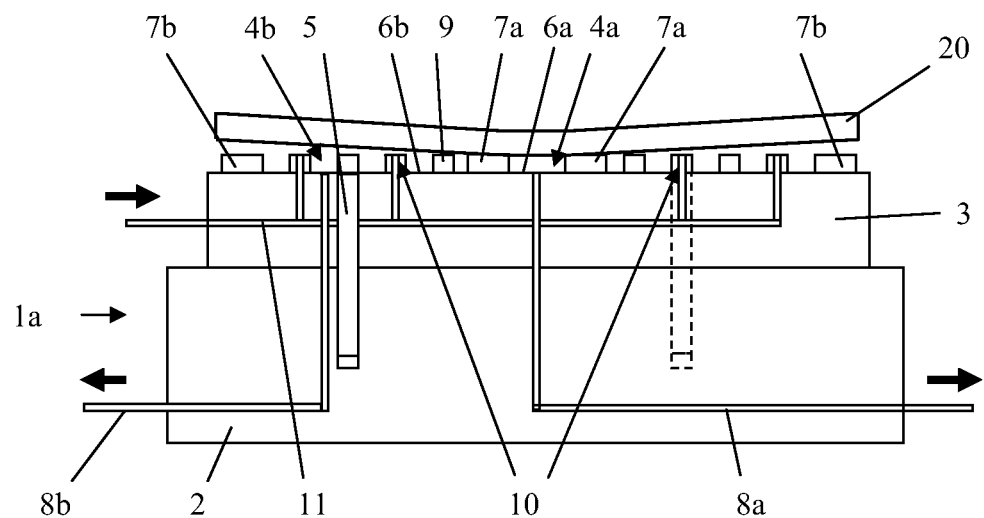
Figure 6C:
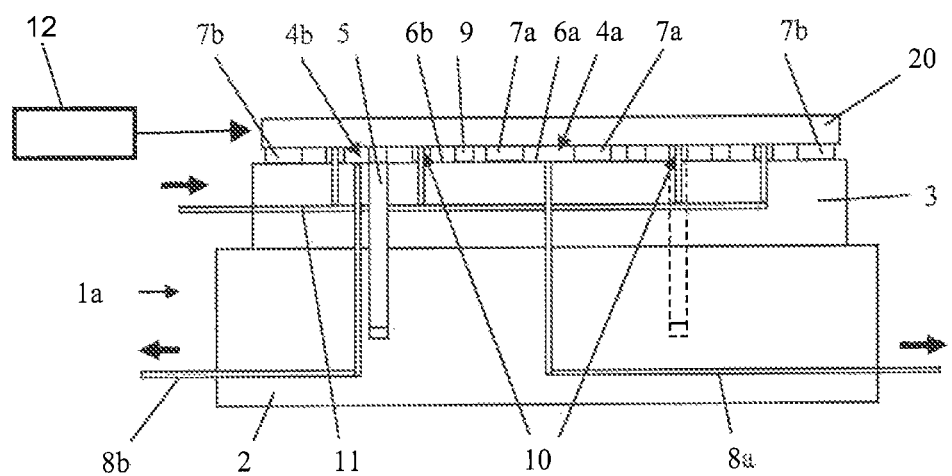

FIGS. 6a-6c show a side view of an alternative embodiment of a substrate support 1a according to the invention. Each of the FIGS. 6a-6c shows a step during shaping and clamping of a warped substrate 20 on the substrate support 1a. Features of substrate support 1a having the same or substantially the same function as in the embodiment of FIGS. 2, 3 and 5a-5c have been given the same reference numerals.

The top side of the substrate support 1a comprises a first vacuum clamp 4a and a second vacuum clamp 4b to clamp a substrate on the substrate support 1a. The first vacuum clamp 4a is configured to clamp a center part of a substrate and is delimited by the circular inner sealing rim 7a. A gas suction conduit 8a is provided to draw gas out of a vacuum space defined by a recessed surface 6a and sealing rim 7a.

The second vacuum clamp 6b is annular and concentrically surrounds the first vacuum clamp 6a. The second vacuum clamp 6b is configured to clamp a circumferential area of a substrate surrounding the center part of the substrate. The second vacuum clamp 4b is delimited by the inner sealing rim 7a and a circular outer sealing rim 7b. A gas suction conduit 8b is provided to draw gas out of a vacuum space defined by a recessed surface 6b between the inner sealing rim 7a and the outer sealing rim 7b.

In the recessed surface 6b a number of burls 9 is arranged. The top ends of the burls 9 provide in combination with top ends of inner sealing rim 7a and outer sealing rim 7b support surfaces for a substrate to be placed on the substrate support 1a.

In a number of burls 9 nozzles 10 are provided. The nozzles 10 are arranged in the burls 9 in the recessed area 6b so that a rejecting force may be exerted on another part of a substrate than the center part of the substrate. The nozzles 10 are connected to a gas supply conduit 11 and are configured to provide a jet substantially perpendicular to the main plane of a substrate supported or to be supported on the substrate support 1a.

FIG. 6a-6c show some steps of an alternative clamping method according to the invention for clamping a substrate 20 on a substrate support 1a.

FIG. 6a shows the substrate support 1a, whereby a substrate 20 is placed on the retractable pins 5. The substrate 20 is warped, which for instance may be caused by a pre- or post exposure process such as coating, baking, chilling or developing of the substrate. In the present method the pins 5 are lowered until the support is at least partially supported on the substrate support 1a. Then the first vacuum clamp 6a clamps the center part of the substrate 20 on the support. Thereafter, the substrate 20 is brought in a desired cup or concave shape by jetting air or another suitable gas out of the nozzles 10.

In FIG. 6b the substrate 20 is shown in the cup or concave shaped state. During this state the second clamping device 4b may exert an attracting force on the substrate 20, but the jetting force exerted by gas jets emerging from the nozzles 10 is larger so that the circumferential part of the substrate bends up from the substrate support to form the cup or concave shape as shown in FIG. 6b.

Since in this state the substrate 20 is clamped by the first vacuum clamp at the center part of the substrate 20 fixation for the substrate is provided in the x, y and Rz directions. Undesired floating of the substrate 20 in these directions is substantially prevented, while the pins 5 may be fully retracted in the substrate support and have no mechanical influence on the substrate 20.

When the attracting force of the second vacuum clamp is gradually increased and/or the rejecting force of the jets is gradually decreased, the substrate will be clamped on the substrate support in radial direction starting from the central part. As a result, the substrate 20 will be clamped on the substrate support 1a without or with substantially decreased internal stresses since the substrate 20 is gradually "rolled out" on the substrate support 1a. As a result, overlay errors may be avoided.

In alternative embodiments it may be possible that the first clamping device 4a is not configured to clamp at first instance a center part of a substrate 20, but another part of the substrate 20, for instance an edge of a substrate. In such embodiment the substrate may be clamped on the substrate support 1a after shaping the substrate in a form wherein it is only clamped at the part, starting from this part of the substrate.

In the embodiment shown in FIGS. 6a-6c the first and second vacuum clamp 4a and 4b in combination exert an attracting force on the whole surface area of the substrate 20. In another embodiment a first clamping device may be provided to exert a clamping force on only a part of a substrate, and a second clamping device may be provided to exert a clamping force on the whole surface area of the substrate. In such embodiment the first clamping device may be used as a pre-clamping device configured to hold only a part of the substrate during shaping and the second clamping device may be used as clamping device during the actual lithographic process. Any suitable clamping device such as vacuum clamp, electrostatic, magnetic or electromagnetic device may be used as clamping device.

In the embodiment shown in FIGS. 6a-6c nozzles 10 are provided in the recessed surface 6b. In alternative embodiments nozzles 10 may also be provided in the recessed area 6a as long as during shaping the attracting force of the first vacuum clamp is larger than the jetting force of jets emerging from the nozzles in the inner recessed area 6b. In another embodiment the nozzles may only be provided at the circular edge of the substrate support, thus being configured to exert a rejecting force on only the circumferential edge of a substrate to be placed on the substrate support.

In an embodiment of the substrate support different groups of nozzles may be provided each group being connected to a separate gas supply conduit. Such embodiment makes it possible that each group of nozzles may be used to provide a different jetting force, therewith making more accurate control of the forces exerted on the substrate possible.

In such embodiment it is preferable to arrange the groups of nozzles in concentric circles around the first clamping device configured to clamp a part of a substrate during shaping of the substrate. Also, the second vacuum clamp or more generally, the second clamping device may be subdivided in a number of preferably concentrically arranged clamping devices to make more accurate control of the attracting forces exerted on different parts of a substrate possible.

FIGS. 7a and 7b show another embodiment of a substrate support 101 according to the invention. The substrate support 101 comprises three substantially concentric annular vacuum clamps 102, 103, 104, each comprising a number of vacuum holes 105 arranged in a circular configuration.

The vacuum holes 105 of each of the annular vacuum clamps 102, 103, 104 are connected to a common vacuum source 106 via a vacuum line 107, 108, 109, respectively. In each vacuum line 107, 108, 109 a flow restriction 112 is provided. Such flow restriction 112 provides a certain flow resistance against flow through the respective vacuum line 107, 108, 109. The flow resistance of the vacuum line 109 of the outer annular vacuum clamp 104 is larger than the flow resistance of the vacuum line 108 of the middle annular vacuum clamp 103, and the flow resistance of the vacuum line 108 of the middle annular vacuum clamp 103 is larger than the flow resistance of vacuum line 107 of the inner annular vacuum clamp 102.

Surrounding the outer annular vacuum clamp 104, an annular rejection force device 110 is arranged to provide a rejecting force on or nearby the edge of a substrate to be loaded. The rejection force device 110 is arranged concentrically with the annular vacuum clamps 102, 103, 104, and comprises for instance a number of nozzles arranged in a circle which are configured to jet air or another gas in the direction of a substrate to be loaded.

The substrate support 101 of FIGS. 7a and 7b is in particular suitable for warped substrates of which, during loading, the edge would contact the substrate support 101 before the centre of the substrate when no extra measures would be taken. As a result, the roll off of the substrate during the build up of clamping force may result in stresses and deformations in the substrate, in particular at the centre of the substrate. Differences in the friction coefficient between substrate and substrate support and differences in substrate shape may strongly effect the location of deformations.

To avoid the above stresses and deformations, it is proposed to clamp or preclamp the warped substrate with the annular vacuum clamps 102, 103, 104 of the substrate support 1 as shown in FIGS. 7a and 7b, while simultaneously exerting a rejection force with the rejecting force device 110 on or nearby an outer edge of a substrate 120 (shown in dashed lines) to be loaded to avoid that the outer edge contacts the substrate support when the substrate is lowered towards the substrate support, for instance by means of e-pins 111. A vacuum is applied to the annular vacuum clamps 102, 103, 104 so that an attracting force is exerted on the substrate 120.

Since the flow resistance of the vacuum line 107 of inner annular vacuum clamp 102 is relatively low, an applied vacuum will favor the inner annular vacuum clamp 102 until the substrate 120 is clamped on the inner annular vacuum clamp 102. As a result of the clamping, the flow resistance of the vacuum line 107 of the inner annular vacuum clamp 102 increases quickly and the vacuum will favor the middle annular vacuum clamp 103. When the substrate is also clamped on the middle annular vacuum clamp 103, the outer annular clamp 104 will be favored.

The clamping forces and rejecting forces exerted on the substrate 120 are shown in dashed arrows in FIG. 7b. The thickness of the arrows of the annular clamps 102, 103, 104 indicates that the vacuum applied will in first instance be favored by this annular clamp as the flow resistance in the vacuum line 107 of this inner annular vacuum clamp 102 is relatively small.

In this way, the substrate is clamped on the substrate starting at the centre part of the substrate and then enlarging the surface of the substrate which is clamped in a radial direction.

When the wafer is clamped by all three annular vacuum clamps 102, 103, 104, the rejection force may be taken away or decreased and the edge of the substrate may come into contact with the substrate support 101. Since the edge of the substrate is the last part to come into contact with the substrate support 101, stresses and deformations of the substrate are avoided. Then the substrate is completely clamped on the substrate support.

In an alternative embodiment, the inner annular clamping device 102 may be of circular shape. Such circular shape is regarded to be annular in view of the application of the present invention. Furthermore, it is remarked that the flow resistance as shown in FIG. 7b is obtained by providing flow resistors. It may also be possible to obtain the different flow resistances by the shape and length of the vacuum lines of the different annular vacuum clamps, or by any other means.

Dependent on the specifications of the substrate and the requirements on internal stresses and deformations after clamping, more or less annular vacuum clamps may be provided. Furthermore, any other type of clamping device may also be applied as annular clamping device. Preferably the clamping force of each of the annular clamping devices is adapted or adaptable such that the clamping will start from the most inner annular clamping device and radially extend to the edge of the substrate. Any other suitable roll off of the clamping, for instance starting from an edge of the substrate may also be applied.

Any suitable type of device for exerting a rejecting force on a substrate such as nozzles, electrostatic, magnetic or electromagnetic device may be used.

Hereinabove, it was explained how a substrate may be shaped before completing clamping (i.e. finishing complete clamping) on a substrate support by exerting simultaneously attracting and rejecting forces on the same or different parts of the substrate. In this way the shape of the substrate is controlled during the loading process. It is remarked that the term complete clamping relates to a substrate clamped on the substrate support at the end of the substrate loading process, and thus ready for further processing, for instance in a lithographic process. Complete clamping does therefore not necessarily mean that a clamping force is exerted on the complete surface of the substrate.

Above the use of devices and methods for controlling the shape of an object before the status of complete clamping is reached is explained at the hand of a substrate support 1 and a substrate 20 to be clamped on such support. Such device and method may be used for clamping another object, in particular a warped plane-shaped object, such as a warped plate or sheet, on a support in order to control the shape in which the object is clamped on the support, in particular to avoid internal stresses in the object after clamping. Such embodiments are deemed to fall within the scope of the present invention.

The invention of using a rejecting and attracting force simultaneously could also be applied to other objects to be held in a position and/or for reducing stress in the held object.

An example object to be held in a similar way could be the reticle/mask or patterning device. Any of the embodiments is suited to be used for clamping the patterning device and/or a skilled person is able to adapt the embodiments in order to hold the patterning device.

According to an embodiment the apparatus and method comprises shaping the object to a desired shape, preferably reducing internal stress in the object, possibly resulting in a reduction of overlay errors. In an embodiment the shaping is performed before complete clamping of the object on the support. The shaping using the attracting and rejecting force is performed in an embodiment in a loading station of the object onto the table. Complete clamping in an embodiment comprises in an embodiment positioning the object relative to the table in a position which the object will generally maintain during further operation. The object could already be completely clamped if in a later step a further subsequent clamping action is performed. In an embodiment completely clamped is equivalent to switching off the rejecting force or at least reducing the rejecting force. This can be the complete switching off of the rejecting force or can be only a local switching off, for only a part of the area of the object submitted to the rejecting force.

In an embodiment an external source, external from the object table is used for the attracting force or for the rejecting force or for both force. Here an external source is a source not directly connected to the clamping device, and in an embodiment not connected directly to the object table. An embodiment comprises an air jet which is located above the object table, fixed to a different part of an apparatus, such as the lithographic apparatus.

In an embodiment a flexible element is provided as part of the clamping device or as part of the object table. The flexible element, such as a spring or a flexible wall element can extend upwards from the clamping device or object table. It can provide for a rejecting force away from the clamping device.

Earlier the rejecting force and the attracting force are forces as defined from a view point of the clamping device. The rejecting force is a force away from the clamping device. The attracting force is a force towards the clamping device. The forces can be provided using units that each only provide for either an attracting force or a rejecting force. It will be clear to the person skilled in the art that the invention encompasses that attracting forces are embodiments of forces forcing the substrate and the support towards each other and the rejecting forces are embodiments of forces forcing the substrate and the support away from each other. In an alternative embodiment a vacuum force is applied to a surface of the object facing away from the substrate support 1 to force the substrate away from the support.

In yet a further embodiment the method comprises a step of reducing stresses in the substrate by applying a vibrating action onto the substrate during loading and/or while loaded. By vibrating internal stresses in the substrate can be released. The vibrating action can be applied by using a spring or a flexible element. The vibrating tool can be actuated. A suitable actuator can be used. In an embodiment a vibrating action is applied onto the substrate starting in a central part of the wafer. The vibrating action can be applied to the substrate/object by a central gripper. In a further step subsequent vibrating actions can be applied to more externally located parts of the object. In this manner stresses in the object are preferably 'moved' to the external parts of the object, preferably 'released'. In an embodiment the E-pins are used as vibrating devices to bring the object into vibration.

The vibrating action can be a very short action, e.g. only one or even half period. The vibrating action is characterized by at least one action, preferably a movement with respect to an equilibrium position. It can be an offset movement. It is believed that such a vibrating action would have a stress reducing effect in the object as the vibrating action can result in a wave-like stress releasing lobe moving through the object material. It is believed that such a wave like motion is more effective in reducing local stress areas in the object.

In a further embodiment a striking device 12 can be used to apply a vibration onto the object. By striking the object a one time disturbance, in this case an excessive disturbance, is transferred onto the object, which disturbance can be used to dissipate or release other internal stresses over the object. The striking device 12 can also initiate a wave like motion in the object.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A clamping device configured to clamp an object on a support, the clamping device comprising:
a first device configured to force the object and the support away from each other using a first force; and
a second device configured to force the object and the support towards each other using a second force, wherein the first device and the second device are configured to:
simultaneously exert the first force and the second force respectively to shape the object to a desired shape before clamping the object on the support; and
decrease the first force and increase the second force respectively to clamp the object on the support.

2. The clamping device of claim 1, wherein the first force is a rejecting force.

3. The clamping device of claim 1, wherein the second force is an attracting force.

4. The clamping device of claim 1, wherein the first device and the second device are configured to maintain the object and the support at a balance distance from each other by operating simultaneously and in cooperation with gravity.

5. The clamping device of claim 4, wherein the first device and the second device are configured to hold the object at the balance distance during shaping of the object to the desired shape while the object is not in contact with the support.

6. The clamping device of claim 4, wherein the first device and the second device are configured to decrease the distance between the object and the support during shaping.

7. The clamping device of claim 1 having an operating range, wherein the first force depends on the distance between the object and the support such that it decreases at an increasing distance between the object and the support and wherein the second force is less dependent on the distance than the first force.

8. The clamping device of claim 7, wherein the operating range comprises the balance distance.

9. The clamping device of claim 8, wherein, after correcting for gravity, in the operating range at distances smaller than the balance distance the first force is larger than the second force and at distances larger than the balance distance the first force is smaller than the second force.

10. The clamping device of claim 1, wherein:
the first device is configured to exert the first force on a part of the object; and
the second device is configured to exert the second force on at least another part of the object.

11. The clamping device of claim 10, wherein:
the part of the object is a central part of the object; and
the at least another part at least partially surrounds the central part.

12. The clamping device of claim 10, further comprising a third device configured to force the object and the support towards each other using a third force, the third force alone or in combination with the first force being exerted on a major part of the surface of the object facing the support.

13. The clamping device of claim 1, wherein the second device comprises a vacuum clamp or an electrostatic clamp.

14. The clamping device of claim 1, comprising:
a first clamp configured to interact with a first region of the object; and a second clamp configured to interact with a second region of the object, wherein the second region surrounds the first region.

15. The clamping device of claim 14, wherein the clamping device is arranged to influence the order in which parts of the object are clamped by the first clamp and the second clamp by varying the clamping force of each of the first clamp and the second clamp.

16. The clamping device of claim 14, wherein:
the first clamp comprises a first vacuum clamp having a first vacuum line provided with a first flow restriction; and
the second clamp comprises a second vacuum clamp having a second vacuum line provided with a second flow restriction, the flow resistance at the first flow restriction being smaller than the flow resistance at the second vacuum line.

17. The clamping device of claim 1, wherein at least one of the first device and the second device is configured to exert its corresponding force on the object without having mechanical contact between the at least one of the first device and the second device and the object.

18. The clamping device of claim 1, wherein at least one of the first device and the second device is arranged to exert a vibrating action onto the object.

19. The clamping device of claim 1, further comprising a striker unit for striking the object.

20. The clamping device of claim 1, wherein the support is a substrate support of a lithographic apparatus and the object is a substrate.

21. A lithographic apparatus comprising the clamping device of claim 20, the substrate support comprising the clamping device.

22. A method for loading an object on a support, the method comprising:
subjecting the object to a first force, using a first device, that forces the object and the support away from each other;
subjecting the object to a second force, using a second device, that forces the object and the support towards each other, the object being subjected simultaneously to the first and second forces;
shaping the object in a desired shape, using the first device and the second device, by the simultaneous subjection to the first and second forces; and
clamping the object on the support after the shaping of the object, wherein the clamping comprises decreasing the first force with respect to the second force.

23. The method of claim 22, further comprising holding the object at a balance distance of the support during shaping of the object.

24. The method of claim 22, further comprising decreasing the distance between the object and the support during the shaping.

25. The method of claim 22, wherein the shaping comprises straightening of the object to the desired shape while the object is not in contact with the support.

26. The method of claim 22, comprising shaping the object in an operating range of the distance between the object and the support, the operating range being a range wherein the second force depends less on the distance than the first force.

27. The method of claim 26, wherein the operating range comprises a balance distance, in which the first force and the second force are arranged to maintain the object and the support in the presence of gravity.

28. The method of claim 27, wherein, in the operating range, after correction for gravity, at distances smaller than the balance distance the first force is larger than the second force and at distances larger than the balance distance the first force is smaller than the second force.

29. The method of claim 22, wherein the second force and gravity have a component in the same direction.

30. The method of claim 22, wherein the shaping comprises:
exerting the first force on a first part of the object; and
exerting the second force on a second part of the object, the first part being at least another part of the object than the second part.

31. The method of claim 30, comprising clamping the second part of the object on the support.

32. The method of claim 30, wherein the second part is a central part of the object.

33. The method of claim 30, wherein the first part at least partially surrounds the second part.

34. The method of claim 22, comprising:
clamping a first region of the object with a first clamp; and
clamping a second region of the object with a second clamp, the second region at least partially surrounding the first region.

35. The method of claim 34, comprising choosing the order in which the first region and the second region are clamped.

36. The method of claim 34, wherein surface area of the object clamped on the support is increased starting from the first region.

37. A method for loading a substrate on a substrate support of a lithographic apparatus, the method comprising:
shaping the substrate in a desired shape while keeping the substrate spaced from the substrate support, wherein the shaping comprises subjecting the substrate simultaneously to an attracting force pulling the substrate towards the support and a rejecting force pushing the substrate away from the support; and
completing the clamping of the shaped substrate on the substrate support.

38. A non-transitory machine readable medium encoded with machine executable instructions that, when executed by a machine, cause the machine to perform the steps of:
subjecting an object to a first force, using a first device, that forces the object and the support away from each other;
subjecting the object to a second force, using a second device, that forces the object and the support towards each other, the object being subjected simultaneously to the first and second forces;
shaping the object in a desired shape, using the first device and the second device, by the simultaneous subjection to the first and second forces; and
clamping the object on the support after the shaping of the object, wherein the clamping comprises decreasing the first force with respect to the second force.

39. A clamping device configured to clamp an object on a support, the clamping device comprising:
a first device configured to exert an attracting force on the object;
a second device configured to exert a rejecting force on the object; and
a positioner configured to control the first device and the second device such that the attracting and rejecting forces are simultaneously exerted on the object to shape the object to a desired shape while the object is not in contact with the support and before clamping of the object on the support.

40. The clamping device of claim 39, wherein the first device and the second device are configured to simultaneously exert an attracting and rejecting force such that, at a balance distance above the support, the attracting force and a gravity force on the object are equal to the rejecting force.

41. A method for loading an object on a support, the method comprising:

- shaping the object to a desired shape while not in contact with the support, wherein the shaping comprises subjecting the object simultaneously to an attracting force pulling the object towards the support and a rejecting force pushing the object away from the support, and
- clamping, after the shaping, the object on the support.

42. The method of claim 41, wherein the object is held at a certain distance above the support during at least a period of the shaping of the object.

\* \* \* \* \*